United States Patent [19]

Yarne et al.

[11] Patent Number: 4,638,938

[45] Date of Patent: Jan. 27, 1987

[54] VAPOR PHASE BONDING FOR RF MICROSTRIP LINE CIRCUITS

[75] Inventors: Andrew J. Yarne; Eldon F. Burr, both of Cedar Rapids, Iowa

[73] Assignee: Rockwell International Corporation, El Segundo, Calif.

[21] Appl. No.: 882,215

[22] Filed: Jul. 3, 1986

Related U.S. Application Data

[62] Division of Ser. No. 648,857, Sep. 7, 1984, abandoned.

[51] Int. Cl.⁴ .............................................. B23K 31/02
[52] U.S. Cl. .................... 228/180.1; 29/829; 228/180.2; 228/212; 228/240; 228/242; 228/218; 228/44.7
[58] Field of Search ................. 228/240, 242, 212, 39, 228/44.3, 44.7, 49.1, 218, 180.1, 180.2; 29/829, 830

[56] References Cited

U.S. PATENT DOCUMENTS

| | | | |
|---|---|---|---|
| 3,355,078 | 11/1967 | Smith | 269/21 X |
| 3,617,682 | 11/1971 | Hall | 228/240 X |
| 3,689,985 | 9/1972 | Nier | 228/180.1 |
| 3,976,288 | 8/1976 | Cuomo, Jr. | 269/21 |
| 4,463,892 | 8/1984 | Cusack et al. | 228/212 |
| 4,512,509 | 4/1985 | Ellis, Jr. et al. | 228/180.2 |

Primary Examiner—Nicholas P. Godici
Assistant Examiner—Carmine Cuda
Attorney, Agent, or Firm—Gregory G. Williams; Robert C. Mayes; H. Fredrick Hamann

[57] ABSTRACT

An improved vapor phase soldering process and apparatus are disclosed having particular application to electronic circuitry designed for operation at frequencies higher than 1 MHz. A printed circuit board having a defined circuit pattern on both sides is clamped between two parallel clamping fixtures, one having circuit matching characteristics for the specified PC board, and the fixture further having vents allowing vapor phase gas access to the PC board and soldering process waste gasses egress from the soldering area. This process and apparatus allows shortened soldering time, and improves performance characteristics of the PC board by improving the conduction characteristics of the defined circuit pattern.

3 Claims, 4 Drawing Figures

VAPOR PHASE BONDING FOR RF MICROSTRIP LINE CIRCUITS

This application is a division, of application Ser. No. 6/648,857, filed Sept. 7, 1984, abandoned.

BACKGROUND OF THE INVENTION

This invention relates to electronics assembly processes and apparatus in general, and more particularly to an improved vapor phase assembly process for high frequency stripline circuits.

Vapor phase soldering techniques have been developed recently for reflow soldering in electronics assembly, improving quality, yield, and at reduced cost. The general technique for vapor phase solder reflow is described in a paper delivered at the California Circuit Association, Oct. 21, 1975, by Donald J. Spigarelli and is further described in an article entitled "Condensation/Vapor-Phase Reflow Soldering" by Terrence Thompson, published June 1977, in "Assembly Engineering". That paper and publication provide useful background in the general application of the present invention and are hereby incorporated by reference thereto.

Although vapor phase techniques have found ready application in assembly structure utilizing solder as a joining element, and in circuit reflow applications eliminating solder bridges and icycles produced in a wave soldering process, the inherent advantages of condensation or vapor-phase solder heating techniques have not heretofore been fully realized in a process merely by placing an assembly in the vapor-phase zone of a soldering apparatus. The even heating aspect is limited by the functional access to the work piece provided by the production machinery, and further problems are encountered by the limitations of heat reserve contained in the vapor body, particularly when a large mass relative to the quantity of heat stored in the vapor is inserted into the vapor phase machine. The overall mass of the structure is a critical consideration in determining the length of time necessary for a complete reflow.

SUMMARY AND BRIEF DESCRIPTION

Accordingly, it is an object of the present invention to provide a vapor phase method and apparatus for soldering of microstrip-line circuits providing enhanced ground contact or backplane on one side of a printed circuit board without disturbing a printed circuit on the opposing side of a PC board workpiece.

Another object of the present invention is to provide an improved clamping fixture for vapor phase soldering of a printed circuit board workpiece requiring reduced exposure time to the soldering gas while retaining a rigidly clamped fixture with very little chance for thermal warpage.

Briefly, and in accordance with the present invention, a clamping fixture for use in conjunction with vapor phase soldering apparatus comprises a substantially rigid plate member having at least one contacting surface for a workpiece, at least one area of the contacting surface having a defined relief clearance area thereon, and at least one vent provided in the relief clearance area. The relief clearance area precludes the possibility of solder joining the clamping structure to the workpiece and in conjunction therewith, the vent allows the soldering gas access to that area of the printed circuit board contained within the relief clearance area of the contacting surface of the clamping fixture.

Various "personality" faces for the clamping fixture are constructed conforming precisely to mirror images of specified printed circuit boards. These faces, in conjunction with the rigid clamping fixture having mated vent extensions and additionally having material removed in non-structure support required areas for mass reduction, provide an increased flexibility for vapor phase soldering a variety of printed circuit boards, improving performance of the finished circuit, while simultaneously shortening fabrication time and reducing cost.

The invention may best be understood by reference to the following detailed description when read in conjunction with the accompanying drawings in which.

DETAILED DESCRIPTION OF THE DRAWINGS

Figure 1:
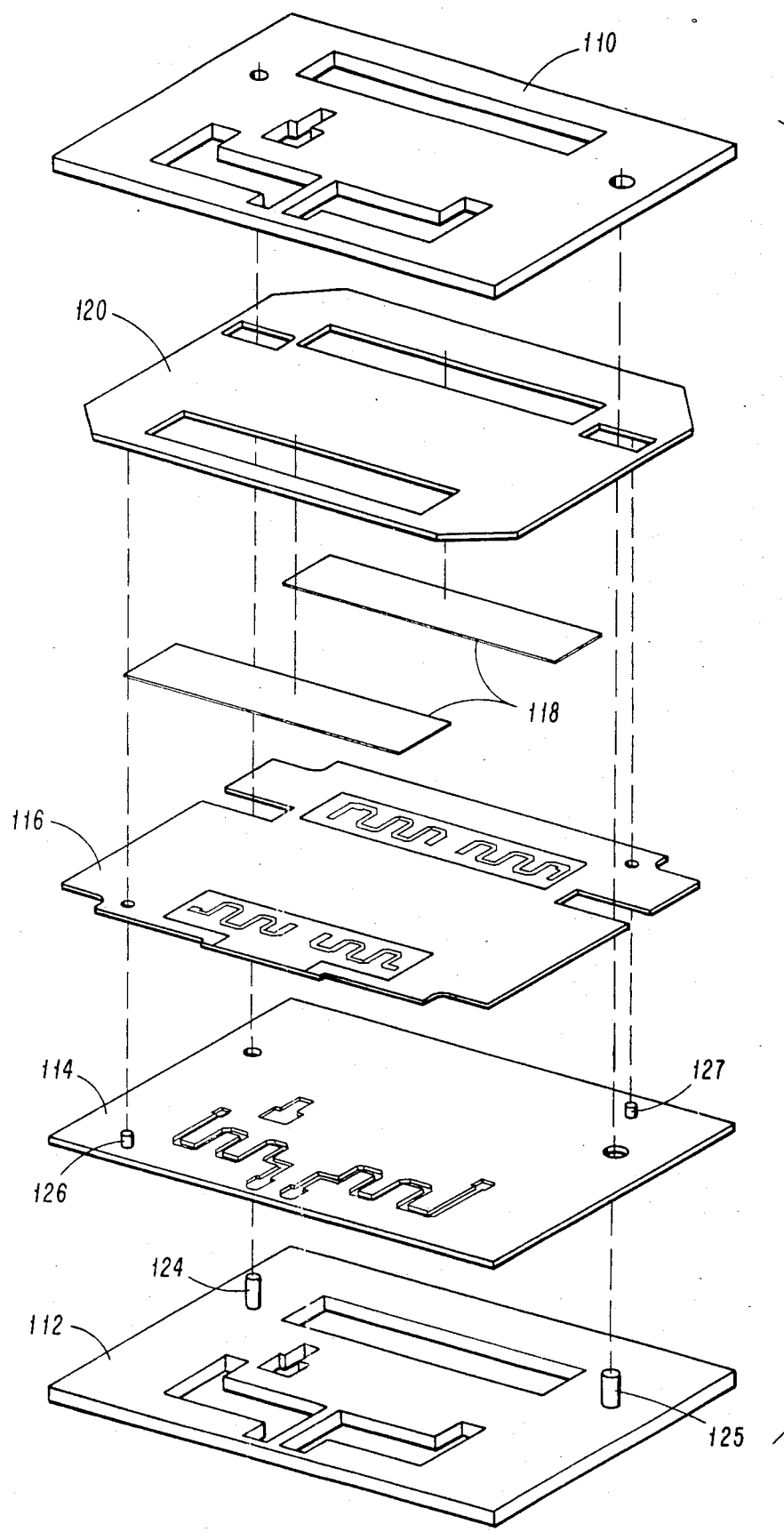
FIG. 1 is an expanded view of a clamping fixture, clamping face and unassembled workpiece showing relative positioning of each of the components prior to vapor phase soldering.

Referring now to FIG. 1, an expanded view of a clamping fixture, clamping face, and unassembled workpiece are shown in their relative positions of each of the components prior to vapor phase soldering. The clamping fixtures 110, 112 are keyed together, when assembled, by keys 124, 125. Key 124 is of a smaller diameter than key 125 providing a readily ascertainable method for proper assembly.

Clamping face member 114 shows generally the workpiece keys 126, 127 for aligning the workpieces 120, 116 with the solder form 118 therebetween. The keys 126, 127 are useful in preassembling a specified circuit which can then be clamped between fixtures 110 and 112 immediately prior to vapor phase soldering. The clamping face 114 necessarily has a corresponding configuration of relief relative to the unsoldered side of PC board 116. The workpiece chassis member 120 is, in one embodiment, pre-tinned for ready application of solder forms 118 during vapor phase process.

The facing member 114 is readily matched to a specified circuit board 116 in preferred embodiments by utilization of a photomask/etch process known in the art. This matching of the facing member 114 to a specified workpiece 116 is facilitated by utilizing the same mask to define the relief structure on the facing member 114 as is used to etch the copper conduction paths on the PC board 116. The choice of materials in the facing member 114 and in the clamping fixtures 112, 110, is essentially optional; however, a rigid aluminum alloy was chosen for the advantages of its relative stiffness for rigidity during soldering, and its low mass which allows a shorter heating time during vapor phase processing. Thus the clamping face 114 may be milled, or etched, in accordance with known material removal techniques.

The workpiece chassis member 120 is, as previously stated, pre-tinned in a preferred embodiment, and placed directly on PC board 116 with solder preforms 118 positioned therebetween. Alternative solder material found useful is solder paste applied directly to the circuit pattern on PC board 116.

Clamping fixtures 112, 110 are therefore readily used with a variety of individualized or "personalized" clamping face members 114, having the appropriate keying provisions for keys 124, 125. The facing member 114, however, is personalized to the specific PC board 116 so that in applying pressure during the vapor phase process, the relieved portion of the clamping face 114 does not contact and therefore adhere to the opposing side of the PC board 116.

Subsequent to vapor phase soldering, the chassis member 120, solder forms 118, and the PC board 116 are firmly attached each to the others in an integral unit, and have a high integrity groundplane conduction characteristic as a result of the rigid clamping and solder gas access provision during vapor phase soldering. The solder gas access is provided through vents in the relieved portion of the clamping face 114 as is shown in further detail in FIGS. 2–4.

Figure 2:
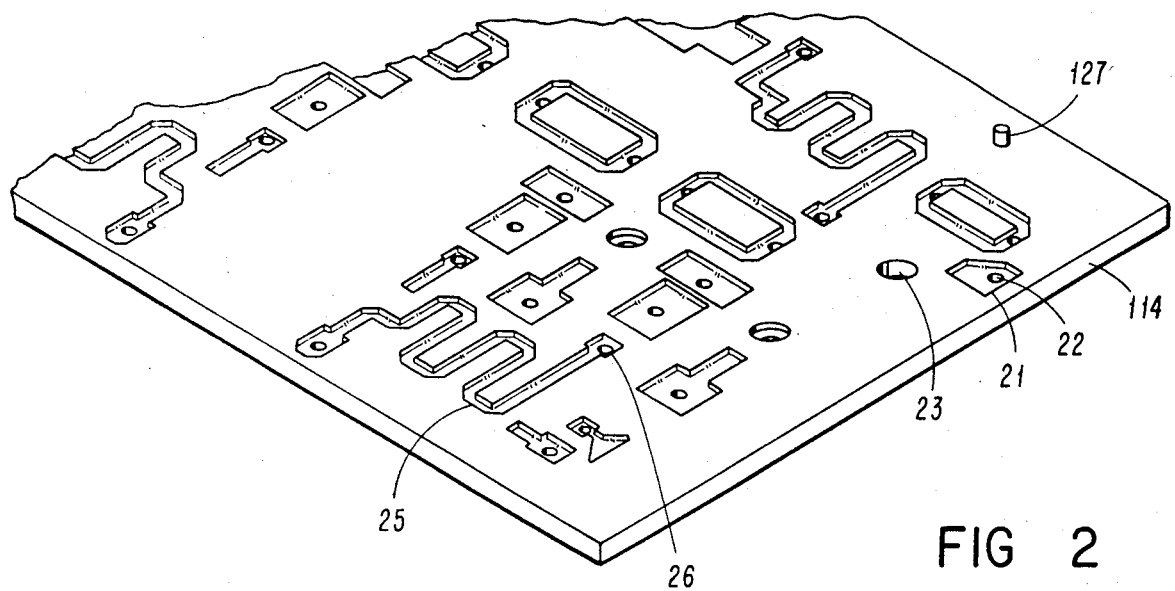
FIG. 2 is a detailed perspective drawing of the facing surface of the clamping fixture showing the relief and venting features thereon.

Referring now to FIG. 2, a perspective view of a clamping face 114 is shown in closer view having the relieved portions 25, 21, shown with vents 26, 22, respectively, therein. Keying hole 23 is provided for mating the clamping fixtures to hold the entire assembly, and key 127 is provided for positioning the PC board in contact with clamping face 114 as well as keying the chassis member in proper relationship to the PC board.

Figure 3:
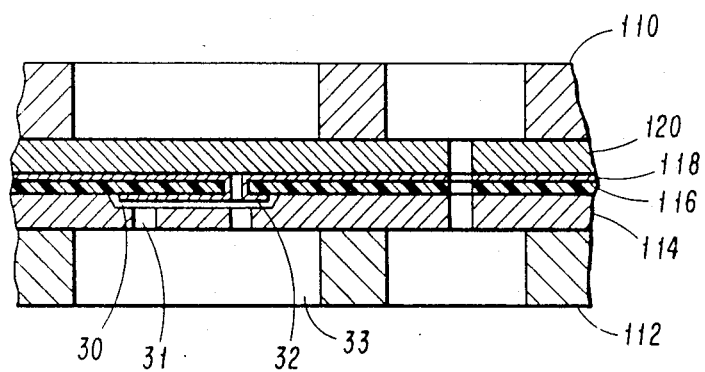
FIG. 3 is a cross-sectional view of the clamped fixture in conjunction with the workpiece.

Referring now to FIG. 3, a cross-sectional view of a clamped fixture in conjunction with the workpiece is shown having a top clamp fixture 110 in contact with chassis member 120 with the solder preform 118 next to and in conjunction with PC board 116. The workpiece in this embodiment consists of the chassis member 120, solder form 118, and PC board 116 held rigidly by clamping fixture 110, 112 with the facing member 114 in direct contact with the PC board 116. The relieved portion 30 of clamping face 114 is shown in proper relative position to a circuit conduction feature 32 on PC board 116.

The circuit conduction feature in a typical embodiment is the result of etching a copper clad printed circuit board leaving a copper or copper alloy conduction pattern on the board material. This copper material is typically tinned with a solder material to facilitate subsequent connection of discrete components and wires.

The space between the relieved portion 30 and the circuit conduction feature 32 allows rigid clamping of the face 114 to PC board 116 during vapor phase soldering without disturbing the feature itself. The vent 31 allows vapor phase gas access to the entire conduction feature of the PC board in an even manner allowing rapid and stable temperature equalization over the entire circuit board/chassis combination. The vent extension 33 in the clamping fixture 112 allows vapor phase gas access to vent 31 and therefore to the workpiece itself.

Figure 4:
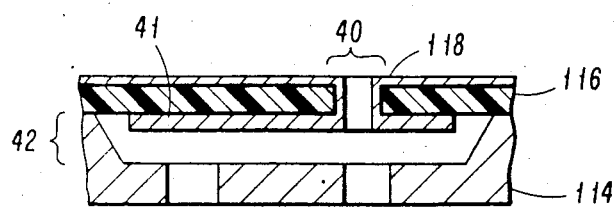
FIG. 4 is an expanded cross-sectional view of one region of FIG. 3 showing in detail the relative positioning of the facing member, printed circuit board workpiece, and soldering material.

Referring now to FIG. 4, an expanded cross-sectional view of one region of FIG. 3 showing in detail the relative positioning of the facing member, printed circuit board workpiece, and soldering material, is shown, with the relieved feature 42 providing for soldering gas access to the circuit conduction characteristic 41, as well as to the plated-through hole feature 40 of the PC board 116. The solder preform 118 provides, subsequent to vapor phase processing, an excellent mechanical bond to the chassis member, as well as a superior groundplane feature particularly useful in microstrip line circuits. Note that facing member 114 has a relief feature 42 in close correspondence to the circuit conduction feature 41 of the PC board 116. This matching characteristic of facing member 114 to the PC board 116 allows firm clamping during vapor phase processing, without disrupting the circuit conduction feature 41 which will typically be pre-tinned as well.

During vapor phase soldering, the entire fixture and workpiece assembly is positioned with the non-contacting side of the PC board upward (as is shown in FIG. 4, inverted). This allows the fluid aspects of molten solder on conduction characteristic 41 to provide a smooth, continuous aspect during and subsequent to reflow.

Boards constructed in accordance with the present method demonstrated bonds found during testing to be mechanically superior to a copper plate adhering to a fiber epoxy PC board. This resulted, during destructive testing, in removing the copper plating from a fiber epoxy PC board before separation of the solder bond between PC board and chassis member could be affected. Thus, the mechanical bonding was shown to be excellent, and the conduction characteristic of the groundplane utilizing the present technique was electrically superior as well.

Although the invention has been described with reference to a specific preferred embodiment thereof, it will be understood that variations and modifications can be made within the scope of the invention by those skilled in the art. Therefore, it is intended that the appended claims be interpretted as broadly as reasonably permitted by the prior art to include all such variations and modifications within the scope of the present invention.

What is claimed is:

1. A method of forming a stripline circuit assembly comprising the steps of:
   a. providing a clamping fixture with at least one vent therein;
   b. clamping a workpiece chassis member to a stripline circuit with a solder material therebetween utilizing said clamping fixture; and
   c. vapor phase soldering said clamped workpiece chassis member, stripline circuit, and solder, said at least one vent allowing vapor phase soldering gas access to said circuit whereby a high integrity groundplane conduction characteristic is formed.

2. A method as in claim 1 further comprising the step of providing said clamping fixture with a defined relief clearance area, said area containing said at least one vent thereon, and corresponding substantially to said stripline circuit.

3. A method of forming a stripline circuit assembly comprising:
   a. providing a clamping fixture having a workpiece chassis member and a defined relief clearance area with at least one vent therein;
   b. providing a printed circuit board having first and second sides;
   c. providing at least one solder form,
   d. positioning said first side of said printed circuit board in said defined relief clearance area of said clamping fixture;
   e. clamping said printed circuit board to said workpiece chassis member of said clamping fixture with said soldering form therebetween;
   f. vapor phase soldering said printed circuit board, said workpiece chassis member, and said solder form; and
   g. allowing access to said first side of said printed circuit board through said vent.

* * * * *